US010044320B2

(12) United States Patent
Ehsan et al.

(10) Patent No.: US 10,044,320 B2
(45) Date of Patent: Aug. 7, 2018

(54) ROBUST WAVEGUIDE MILLIMETER WAVE NOISE SOURCE

(71) Applicant: The United States of America as represented by the Administrator of the National Aeronautics and Space Administration, Washington, DC (US)

(72) Inventors: Negar Ehsan, Bethesda, MD (US); Jeffrey R. Piepmeier, Millersville, MD (US); Edward J. Wollack, Clarksville, MD (US)

(73) Assignee: The United States of America as represented by the Administrator of the National Aeronautics and Space Administration, Washington, DC (US)

(*) Notice: Subject to any disclaimer, the term of this patent is extended or adjusted under 35 U.S.C. 154(b) by 162 days.

(21) Appl. No.: 15/252,559

(22) Filed: Aug. 31, 2016

(65) Prior Publication Data

US 2017/0359028 A1    Dec. 14, 2017

Related U.S. Application Data

(60) Provisional application No. 62/349,241, filed on Jun. 13, 2016.

(51) Int. Cl.
*H03B 29/00* (2006.01)
*H01P 1/203* (2006.01)
*H01P 5/107* (2006.01)
*H01P 9/00* (2006.01)

(52) U.S. Cl.
CPC ............ *H03B 29/00* (2013.01); *H01P 1/2039* (2013.01); *H01P 5/107* (2013.01); *H01P 9/00* (2013.01)

(58) Field of Classification Search
CPC ............ H03B 29/00; H01P 5/02; H03H 11/02; H03H 1/0007
See application file for complete search history.

(56) References Cited

U.S. PATENT DOCUMENTS

| 8,390,403 B1* | 3/2013 | Schaffner | H01Q 13/02 333/250 |
| 2016/0149562 A1* | 5/2016 | Siles Perez | H03K 5/00006 327/119 |

* cited by examiner

*Primary Examiner* — Jeffrey Shin
(74) *Attorney, Agent, or Firm* — Christopher O. Edwards; Bryan A. Geurts; Mark P. Dvorscak

(57) ABSTRACT

Aspects of the present disclosure involve a system and method for generating noise waves at millimeter wave frequencies. A noise source generator is designed to be connected to a crystalline structure for efficient heat transfer and compatibility with millimeter wave receivers. The use of crystalline structure coupled to the noise source generator allows heat from a biasing device, such as a diode, to be carried away such that the diode is able to generate noise waves while being reversed biased without compromising the device. In another embodiment, the noise source generator includes the use of a backshort transmission line with vias that is connected to the biasing device for heat transfer from the biasing device to the backshort.

20 Claims, 5 Drawing Sheets

ROBUST WAVEGUIDE MILLIMETER WAVE NOISE SOURCE

PRIORITY

The present application claims priority to Provisional Application 62/349,241, filed Jun. 13, 2016 which is herein incorporated by reference.

TECHNICAL FIELD

This disclosure relates generally to millimeter wave noise source generators, and more specifically to a system and method for generating noise waves using a biasing device operational at millimeter wave frequencies.

BACKGROUND

Millimeter- and submillimeter wave remote sensing has atmospheric applications ranging from atmospheric sounding to precipitation and ice cloud measurements. Over the past few decades extensive research has been performed related to the development of receiver components at millimeter- and submillimeter wave frequencies that enable such atmospheric applications. Most research has focused largely on the development of local oscillators, mixers, and the like, that are operational at the millimeter wave frequency range. However, corresponding advances in integrated noise sources are minimal and as such larger, more complex, and costly noise sources are often used for atmospheric applications.

BRIEF SUMMARY

The present disclosure is directed to a millimeter wave noise generating apparatus and method for generating such millimeter wave noise waves. The millimeter wave noise generating apparatus can include a biasing device having a first terminal and a second terminal, the biasing device defined to generate noise waves. The millimeter wave noise generating apparatus can include a backshort transmission line connected to the first terminal. The backshort transmission line defined to compensate a reactance of the biasing device. The millimeter wave noise generating apparatus can further include a crystalline structure connected to the biasing device and the backshort transmission line, wherein the crystalline structure transfers heat from the biasing device to the backshort transmission line. The millimeter wave noise generating apparatus can include a filtering component connected at the second terminal, wherein the filtering component prevents the noise waves from leaking out of the apparatus. The millimeter wave noise generating apparatus can also include a probe connected to the second terminal for providing a path for the noise waves to a wave-guiding structure.

The method for generating millimeter wave noise waves including a diode for generating the noise waves in reverse bias mode. The method compensating a reactance of the diode created when generating the noise waves using a backshort transmission line. The method for generating millimeter wave noise waves transferring, by a crystalline structure, heat accumulated on the diode to the backshort transmission line. Also, the method for generating the millimeter wave noise waves blocking the noise waves to keep them from leaking out of an apparatus by a radio frequency (RF) choke and guiding the blocked radio waves to a wave-guiding structure.

The millimeter wave noise generating apparatus can include a biasing device with two terminals used for generating noise waves. The millimeter wave noise generating apparatus can also include a backshort transmission line that is connected to one of the biasing terminals to compensate a reactance of the biasing device, wherein the backshort transmission line comprises vias for transferring heat from the biasing device to the backshort transmission line. The millimeter wave noise generating apparatus including a filtering component coupled to the other terminal to prevent the noise waves from leaking out of an apparatus. The millimeter wave noise generating apparatus can also include a probe for providing a path for the noise waves to a wave-guiding structure.

BRIEF DESCRIPTION OF THE DRAWINGS

The description will be more fully understood with reference to the following figures and data graphs, which are presented as various embodiments of the disclosure and should not be construed as a complete recitation of the scope of the disclosure, wherein.

DETAILED DESCRIPTION

Aspects of the present disclosure involve systems, methods, devices and the like for generating noise waves at millimeter wave frequencies. In one aspect, a noise source generator is designed to be connected to a crystalline structure for efficient heat transfer and compatibility with millimeter wave receivers. The use of crystalline structure coupled to the noise source generator allows heat from a biasing device, such as a diode, to be carried away such that the diode is able to generate noise waves while being reversed biased without compromising the diode function or reliability.

In another embodiment, the noise source generator includes the use of a backshort transmission line that is thermally coupled to the biasing device for heat transfer from the biasing device to the backshort. The backshort, designed to include vias, provides a pathway for heat to be transferred from the biasing device, enabling a more efficient temperature control and permitting the biasing device to operate with continuous power.

Figure 1:
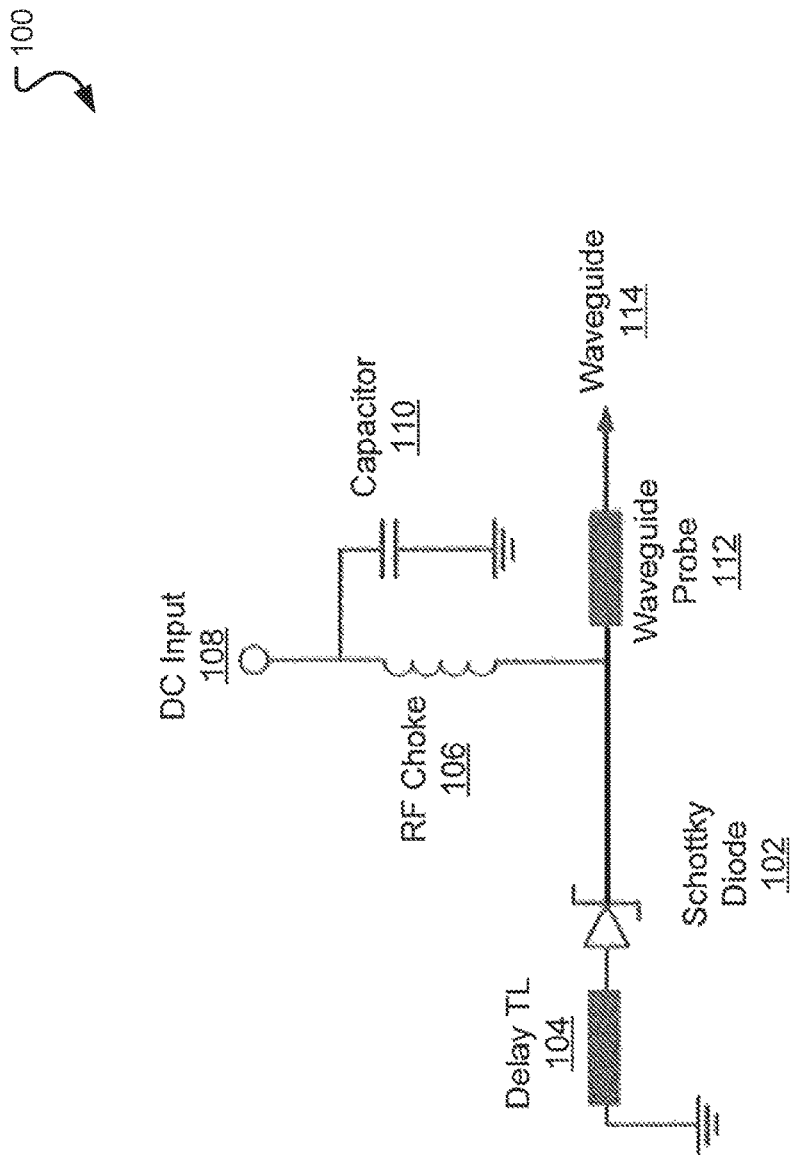
FIG. 1 is a diagram illustrating a noise source generator.

FIG. 1 is a diagram illustrating a noise source generator 100. Noise source generators 100 are devices used to produce electrical noise used to test signals. In remote sensing, noise source generators 100 can be used to calibrate receivers. A noise source generator 100 is generally configured to include a device that generates the noise. The device can be active or passive and can include resistors, diodes, tubes, etc. Biasing devices or diode(s) 102 are most commonly used to generate noise waves and biased using a DC input 108.

Additionally, noise source generators 100 can include other components such as, but not limited to, a delay transmission line 104, RF choke 106, and a waveguide probe 112.

Conventionally, noise source generators 100 have been designed with components that operate at lower frequencies. However, in atmospheric remote sensing and other applications, submillimeter and millimeter wave sensing is desired. In particular, the G-band (160-210 GHz range), is often targeted for these atmospheric applications due to the water vapor absorption line at 183 GHz. Therefore, the design and integration of a millimeter noise source generator is advantageous for its ability to reduce cost, instrumentation, and complexity. Further, an integrated noise source operational at the millimeter and submillimeter wave can enable relative radiant power calibration of the receiver which could reduce and/or eliminate the need for a clear view to cold space in atmospheric applications. In addition, calibration using this approach can take place on a faster timescale and thus improve overall stability and fidelity achieved by the receiver.

As indicated, traditionally the diode 102 has been used as an active component for generating noise waves. The diode 102 can be biased to create noise waves that are provided to a waveguide 114 used for calibrating the front end receivers. Various types of diodes have been conventionally used for noise generation. For example, Zener diodes, temperature-limited vacuum diodes, PIN diodes have been used in noise generation applications, however, the life expectancy of such diodes is often compromised or diminished at millimeter wave operation. Recently, Schottky diodes have been proposed for use in millimeter wave applications for their ability to perform at higher frequencies. A Schottky diode is a semiconductor diode formed by the junction of a semiconductor with a metal with low forward voltage drop and fast switching action. Generally, the Schottky diode has been used with mixers, multipliers and the like in forward bias mode.

However, to enable noise wave generation for millimeter wave applications, the operability of the Schottky diode is reversed. In one embodiment, the Schottky diode is reversed biased into avalanche breakdown to generate the noise waves. In avalanche breakdown, holes and electrons in the depletion region of a reversed-biased pn junction acquire sufficient energy to create hole-electron pairs by colliding with silicon atoms. In other words, noise current arises from collision-induced ionization via free carriers colliding with and knocking free new carriers in the semiconductor. In some instances, diodes 102 can include the two or more Schottky diodes placed in series. For example, the diodes 102 can include two GaAs Schottky diodes (two in series, on one chip). As another example, the diodes 102 can include two GaAs Schottky diodes in series with each diode being 148 µm×45 µm×20 µm in dimension. Note that the values used are exemplary and the use of the diode(s) 102 is not so limited as other dimensions, compositions, and arrangements may be contemplated.

In noise source generator 100, since the diode 102 is being biased, noise wave and RF leakage can occur. To compensate for this noise and/or RF leakage, the noise source generator 100 can be designed to include components that counter it. For example, an RF choke 106 can also be used as part of the biasing circuit to ensure the passage of the direct current from the DC input 108 arrives at the diode 102 while blocking any energy from leaking out. In some instances, the RF choke 106 can be an inductor. In other instances, the RF choke can be a filter. Still in other instances, the RF choke 106 can include a capacitor 110 for blocking RF leakage. For blocking noise, a transmission line (e.g., delay transmission line (TL) 104) can also be added in proximity to the diode 102 to counteract any backpath flow created by the diode 102.

Noise source generators 100 also include waveguide probes 112. A waveguide probe 112 is a component that provides an interface and/or pathway from the diode 102 to the waveguide 114. The waveguide 114 can be any structure that can be used to guide the noise waves toward a device while enabling propagation with minimal loss of energy by restricting the waves to propagating in one or two dimensions.

Figure 2:
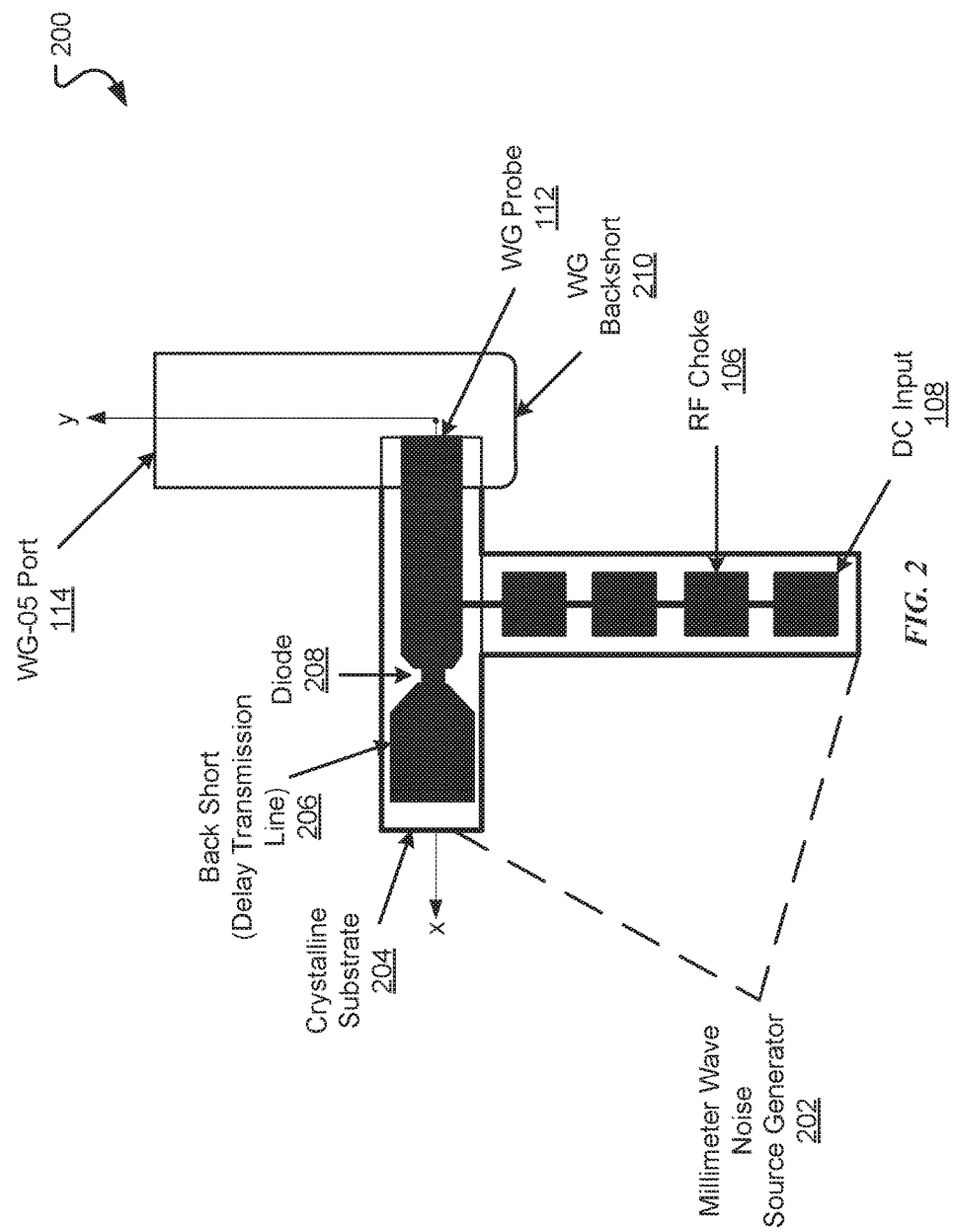
FIG. 2 is a diagram illustrating a simulated millimeter wave noise source generator with on-chip circuitry designed on a crystalline substrate.

Operation of the integrated noise source generator 100 at submillimeter and millimeter frequencies can lead to the generation of heat, which can cause components (e.g., diode 102) to rapidly degrade, overheat, or burnout. To prevent compromising the lifetime of the components, a crystalline substrate 204 can be appropriately attached to the component (e.g., diode 102) such that the crystalline substrate 204 provides good heat transport. FIG. 2 is a diagram illustrating a simulated chip-waveguide noise source 200 with the millimeter wave noise source generator 202 designed on a crystalline substrate 204. In one embodiment, the simulated millimeter wave noise source generator 202 of FIG. 2 may be the noise source generator 100 of FIG. 1 mounted on the crystalline substrate 204 to combat heat.

By mounting the millimeter wave noise source generator 202 on a crystalline substrate 204 (e.g., quartz, floatzone silicon, sapphire, diamond, etc.), heat on the components is minimized and the integrity of the components is maintained. For example, diode 102 can be appropriately attached to the crystalline substrate 204 to ensure the diode 102 runs at a reasonable temperature, such that the diode is not damaged or its lifetime compromised. The crystalline substrate 204 can act as a thermal conductor allowing heat to be carried away from the component (e.g., diode 102) and enabling the component to function under reasonable temperatures. Similarly, the other components on the noise source can also benefit from being mounted on the crystalline substrate 204 such that the heat on the components is minimized. As illustrated in FIG. 2, the crystalline structure 204 extends through the area of the simulated millimeter wave noise source generator 202. Note that the crystalline substrate 204 can be any material with good heat transfer properties. In one embodiment, the crystalline substrate can be diamond, sapphire, etc. In a preferred embodiment, the crystalline substrate can be quartz, which has good conductivity and is easily integrable with other chip devices including standard waveguide flanges operational in the G-band (e.g., WR-05 114).

As illustrated in FIG. 2, the millimeter wave noise source generator 202 can include the standard components e.g., diode 102, bias circuitry (e.g., RF choke 106 and DC input 108), delay transmission line, and waveguide probe 112 described above and in conjunction with noise source generator 100 of FIG. 1. The diode 102 can therefore be one or more Schottky diode (s) 208 (e.g., two Schottky diodes 208 placed in series) for noise wave generation. The Schottky diode(s) 208 can generate noise when operating in reversed biased mode at a high voltage, forcing the Schottky diode 208 into avalanche breakdown. The biasing circuitry can include a low pass filter including an RF choke 106 and/or a capacitor 110 (not shown) for blocking the RF, and a DC input 108. In addition, the delay transmission line 104 can include a backshort 206 designed to reflect the noise from the Schottky diodes 208. A backshort 206 can be a tuning element that can compensate for reactance of the Schottky diodes 208. More simply put, a Schottky diode 208, when operational in reverse-bias mode, generates noise waves from both terminals ends and thus in both directions on the microstrip guide with 180° phase difference. To direct all of the noise to the desired RF path, an RF short or backshort 206 can be designed to reflect the noise from the Schottky diode 208 in the other direction and thus add in-phase with the outgoing noise.

In one embodiment, chip-waveguide noise source 200 is operational at 160-210 GHz. The millimeter wave noise source generator 202 is designed on quartz and implemented into a waveguide housing. The noise generators are Schottky diodes 208 with a low pass filter 106 as part of the bias circuit for biasing the Schottky diodes 208 with an alternating high/low impedance configuration for blocking RF, and a feed-thru (electromagnetic interference (EMI) filter) that connects the filter 106 to bias line with an internal capacitor 110 to short any RF noise coming from the DC path. The backshort 206, used for suppressing reflected noise, is designed with a center frequency at 183 GHz and a microstrip-to-waveguide probe 112 transition is used for coupling to the waveguide 114. In addition, a waveguide backshort 210 may be included or attached to the waveguide prove 112. The waveguide 114 is a WG-05, for G-band operability with a longitudinal probe configuration. Note that design is not so limited and other configurations, components, and substrates may be contemplated.

Figure 3:
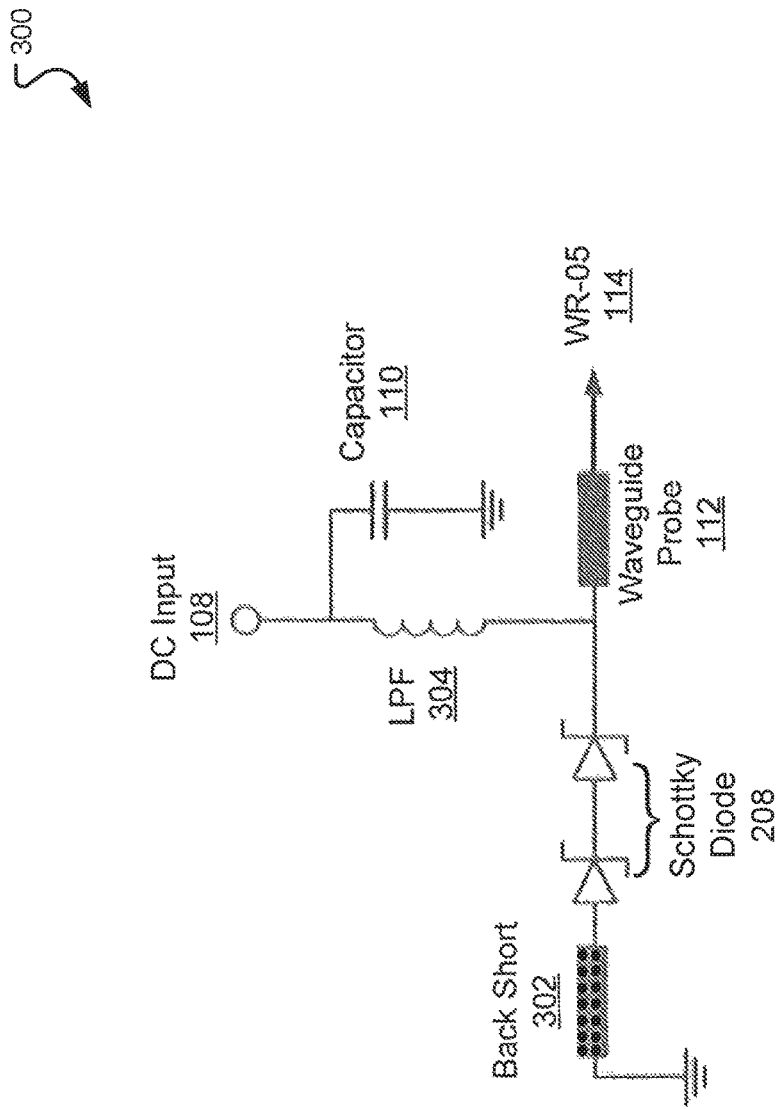
FIG. 3 is a diagram illustrating the millimeter wave noise source generator with a backshort heat sink.

Further to the chip-waveguide noise source 200 design of FIG. 2, FIG. 3 is presented to provide additional heat transfer features that will allow for improved millimeter wave noise source generator 202 functionality. Specifically, FIG. 3 is a diagram illustrating the millimeter wave noise source generator 202 with a backshort heat sink 302. As previously indicated, the backshort 302 is a tuning element that compensates for the reactance in the Schottky diodes 208. The backshort 302, can further be configured to provide a pathway that enables the transfer of heat from the diode 102 to the backshort 302. The backshort 302 as illustrated in FIG. 3 can be designed to include vias. Vias are metal filled conduits that permit the electrical connection between layers in a circuit. Vias can be used to carry heat away from power devices. In one embodiment, the backshort 302 can be designed to include vias to aid in the heat-sinking of the Schottky diodes 208. By enabling heat sinking of the Schottky diodes 208, the Schottky diodes 208 can be powered continuously (e.g., continuously biased) rather than pulsed powered. In one embodiment, the millimeter wave noise source generator 300 of FIG. 3 can include a backshort as a capacitive delay transmission line including vias with phase delays of 180° at 184 GHz, 160° at 191 GHz, and −160° at 176 GHz.

Figure 4:
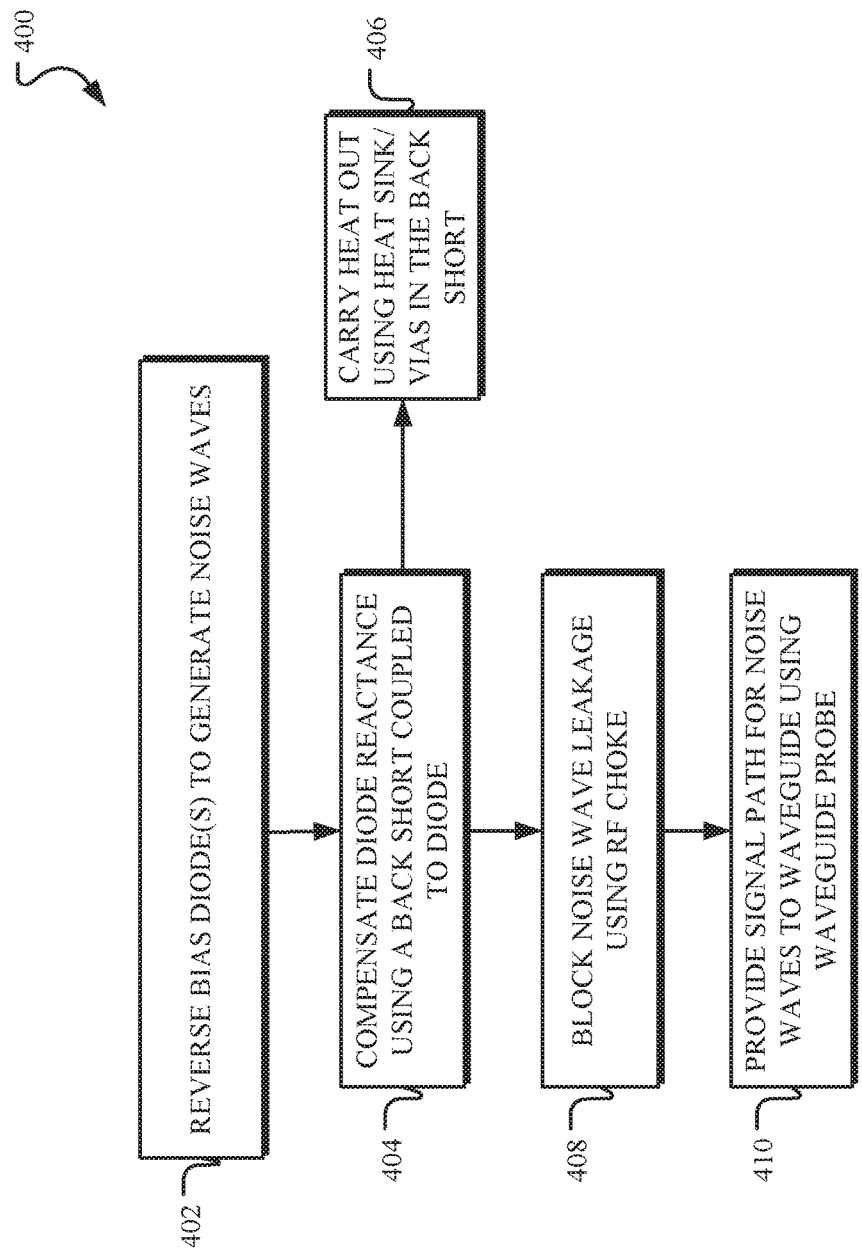
FIG. 4 is a flow chart of a method for using the millimeter wave noise source generator including the backshort heat sink.

FIG. 4 is a flowchart of the various operations of the presently disclosed technology. Specifically, FIG. 4 is a flow chart of a method for using the millimeter wave noise source generator 300 including the backshort heat sink 306. Method 400 begins with operation 402, where one or more diodes 102 are reversed biased to generate the noise waves. As previously indicated, millimeter wave noise source generators 202 play a significant role in remote sensing related to atmospheric applications. Noise waves generated by the millimeter wave noise source generators 202 enable the calibration of the RF front-end receivers and can eliminate the need for a clear view of cold space in atmospheric applications. At high frequencies, Schottky diodes 208, due to the low junction capacitance, have been identified as promising noise sources when reversed biased to avalanche breakdown. The Schottky diodes 208 can be biased using a direct current input.

When the diode 102 is powered/biased, power can leak from both terminals of the diode. To reflect the leakage or reactance of the diode, method 400 continues to operation 404, where a backshort 306 reflects the noise in the other direction so that the reflected noise adds in phase with the outgoing noise in the opposite direction. In some instances, the backshort can be designed to operate at center frequency of 183 GHz and is a delayed transmission line.

In operation 406, in addition to reflecting the noise generated by the diodes 102, the backshort 306 is also used to carry heat out of the diode 102, to which the backshort is thermally coupled or connected. The heat can be carried out using a built in heat sink (e.g., vias) in the backshort 306, which allows the heat to be transferred from the powered diodes 102 to the backshort 306. The use of vias provide constant heat sinking, which enables the diodes 102 to be continuously powered as opposed to being pulsed powered as generally done.

In operation 408, the RF choke or low pass filter 106 is used to ensure the passage of the direct current from the DC input to the diode 102 while blocking any energy from leaking out. The RF choke 106 can include a built in capacitor 110 as part of the biasing circuit to block any RF from leaking out. Note that operation 408 can occur prior to and simultaneously with the compensation by the backshort 306 in operation 408.

In operation 410, the noise waves generated by the Schottky diodes 102 are guided to the waveguide 114 using a waveguide probe 112. The waveguide probe 112 can be added to the noise source generator 100 to couple and provide an interface and/or pathway for the noise waves from the diodes 102 to the waveguide 114. In some instances, the waveguide probe 112 can include a longitudinal probe configuration. Once attached to the waveguide 114, the noise waves can be used for calibrating the front-end of the receiver.

Figure 5A:
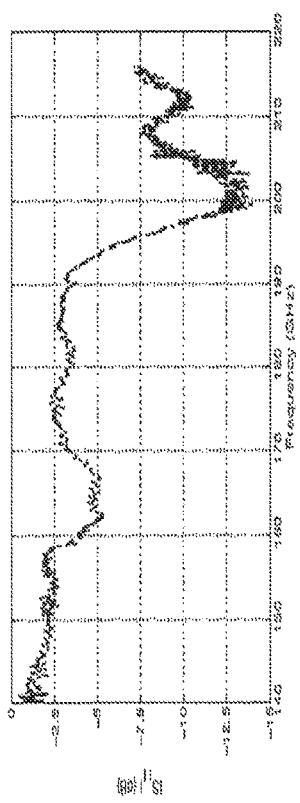
FIG. 5A is a graph illustrating the measured return loss, $S_{11}$ of the millimeter wave noise source generator.
Figure 5B:
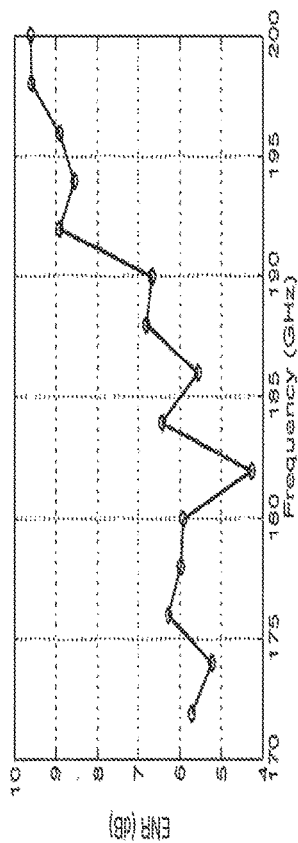
FIG. 5B is a diagram illustrating the measured Excess Noise Ratio (ENR) of the millimeter wave noise source generator over a range of millimeter wave frequencies.

To ensure proper functionality of the noise source generator 100, performance measurements were taken with FIGS. 5A and 5B providing exemplary performance results. Specifically, FIG. 5A includes a graph illustrating the measured return loss, $S_{11}$ of the millimeter wave noise source generator 202. While FIG. 5B is a diagram illustrating the measured Excess Noise Ratio (ENR) of the millimeter wave noise source generator 202 over a range of millimeter wave frequencies.

For the performance measurements, a G-band receiver can be set-up to include any configuration and instrumentation including antennas, waveguides, couplers, amplifiers, and the like. In one embodiment, the measurement system can include a circular G-band horn, an E-plane bend, a 4" waveguide, an 8 dB coupler to couple the noise from the noise source, a second-harmonic mixer from VDI, a ×6 multiplier, a synthesizer, an intermediate frequency (IF) low-noise amplifier (LNA), a bandpass filter centered at 250 MHz with 140 MHz bandwidth, and a power meter.

For the return loss measurement illustrated in graph 500 of FIG. 5A, the circuit was designed to match 50Ω. Return loss is generally the ratio of reflected to incident power in decibels (dB) at a specific reference plane. Therefore, return loss can often be used as a convenient way to characterize an input and output signal source. Return loss can occur when a mismatch exists and is important to be understood as a "return loss" signal may mix with subsequent signals compromising the quality of the received signal and possibly creating errors in the subsequent signal received.

In one embodiment, to verify the transition between the microstrip and the waveguide, return loss measurements were obtained. For example, the microstrip-to-waveguide transition on quartz that was fabricated, and packaged on a back-to-back structure was tested for such measurement. FIG. 5A illustrates the measured return loss, which includes a set of WR-5.1 extension heads and a network analyzer to measure the noise source generator's 100 S-parameters. The extension heads are calibrated. In some instances, to calibrate the extension heads, the short, load, offset short, offset load, and thru (SLOSOLT) calibration method can be used. As illustrated in FIG. 5A, the return loss measurement verifies the performance of the transition from microstrip to waveguide with a return loss is 10 dB up to 210 GHz. As illustrated in FIG. 5A, the return loss results further indicate that the biasing device (e.g., Schottky Diode 306) is well-matched to 50Ω as a −12 dB return loss is achieved at 200 GHz. Bill was measured at bias points from Vd=0.12 V to Vd=0.16:4 V, and no sensitivity to bias voltage was noted. Still further, reanalysis of measurement results indicated that indeed the diode was matched as the input impedance Schottky diode 306 indicated that Schottky diode 306 is capacitive with series resistance on the order of $C_j$=12 fF.

FIG. 5B illustrates the measured Excess Noise Ratio (ENR) of the noise source generator 100. ENR is generally a way of describing the power spectral density of noise with respect to a thermal noise floor. In other words, ENR is a normalized measure of how much the noise source generator 100 is above thermal in its power. ENR can generally be described by the equation below.

$$ENR = 10\log\left(\frac{T_{NS}}{290} - 1\right)$$

To perform the ENR measurements, the thermal noise of the noise temperatures (ON/OFF) of the noise source should be determined. In one embodiment, to obtain the noise source temperature measurements, Y-factor measurement of two targets was identified, one at 77 K and the other at room temperature. The measurement was performed for two cases at each frequency: the diode OFF and the diode ON. For the "ON" state the diode was reverse-biased at Vd=16:39 V and Id=6 mA. The synthesizer frequency was swept to measure the noise at different frequencies. All the front-end losses (waveguide E-plane bend, transmission lines, and the coupler) were measured as an assembly using waveguide extension heads and a performance network analyzer, and used to correct the response. To extract the ENR from the measurements taken, the following equations were calculations that were used:

$$Y_{on} = \frac{P_{onHot}}{P_{onCold}} \quad (1)$$

$$Y_{off} = \frac{P_{offHot}}{P_{offCold}} \quad (2)$$

$$T_{on} = \frac{T_{Hot} - Y_{on} \times T_{Cold}}{Y_{on} - 1} \quad (3)$$

$$T_{off} = \frac{T_{Hot} - Y_{off} \times T_{Cold}}{Y_{off} - 1} \quad (4)$$

-continued $$T_{NS} = (T_{on} - T_{off}) \times C \times \frac{L_2}{L_1} \quad (5)$$

$$ENR = 10\log\left(\frac{T_{NS}}{290} - 1\right), \quad (6)$$

where $P_{onHot}$ and $P_{onCold}$ are the measured powers with the noise diode on looking at the room temperature target and at the cold target, respectively. $P_{offHot}$ and $P_{offCold}$ are the measured power when the noise diode is off looking at the room temperature target and cold target, respectively. L1 is the loss from the bend, 4" transmission line between the antenna and the coupler, and the coupler; C is the coupling factor, and L2 is the loss of the transmission line from the noise source to the coupler.

FIG. 5B illustrates that the measured ENR 550 of the millimeter wave noise source generator 202 is consistent with the return loss measurements of FIG. 5A. As illustrated in the figure, the millimeter wave noise source generator 202 generates approximately 10 dB ENR at 200 GHz which corresponds with a return loss that is best at 200 GHz.

The noise source generators 100, 202, 300 of FIGS. 1-3 are possible examples of a millimeter wave noise source generator that may be employed or be configured in accordance with aspects of the present disclosure. It will be appreciated that other configurations may be utilized.

In the present disclosure, the methods disclosed may be implemented as sets of instructions in hardware or software. It may be further understood that the specific order or hierarchy of steps in the methods disclosed are instances of example approaches. Based upon design preferences, it is understood that the specific order or hierarchy of steps in the method can be rearranged while remaining within the disclosed subject matter. The accompanying method claims present elements of the various steps in a sample order, and are not necessarily meant to be limited to the specific order or hierarchy presented.

While the present disclosure has been described with reference to various implementations, it will be understood that these implementations are illustrative and that the scope of the present disclosure is not limited to them. Many variations, modifications, additions, and improvements are possible. More generally, embodiments in accordance with the present disclosure have been described in the context of particular implementations. Functionality may be separated or combined in blocks differently in various embodiments of the disclosure or described with different terminology. These and other variations, modifications, additions, and improvements may fall within the scope of the disclosure as defined in the claims that follow.

What is claimed is:

1. An apparatus comprising:
   a biasing device comprising a first terminal and a second terminal, the biasing device generating noise waves;
   a backshort transmission line thermally coupled to the first terminal, the backshort transmission line compensating a reactance of the biasing device;
   a crystalline structure connected to the biasing device and the backshort transmission line, wherein the crystalline structure transfers heat from the biasing device to the backshort transmission line;
   a filtering component connected at the second terminal, wherein the filtering component prevents the noise waves from leaking out of the apparatus; and a probe connected to the second terminal for providing a path for the noise waves to a wave-guiding structure.

2. The apparatus of claim 1, wherein the biasing device is reverse biased.

3. The apparatus of claim 1, wherein the backshort transmission line comprises vias for transferring heat from the biasing device to the backshort transmission line.

4. The apparatus of claim 1, wherein the filtering component is a low pass filter.

5. The apparatus of claim 4, wherein the low pass filter comprises an RF choke and a capacitor.

6. The apparatus of claim 2, wherein the biasing device operates in avalanche breakdown mode when reverse biased.

7. The apparatus of claim 1, wherein the crystalline structure is a quartz structure.

8. The apparatus of claim 1, wherein the biasing device is a Schottky diode operating at millimeter wave frequencies.

9. The apparatus of claim 1, wherein the backshort transmission line is in-phase with the noise waves.

10. A method comprising:
   generating, by a diode, noise waves wherein the noise waves are generated by reverse biasing the diode;
   compensating, by a backshort transmission line, a reactance of the diode created when generating the noise waves;
   transferring, by a crystalline structure, heat accumulated on the diode to the backshort transmission line;
   blocking, by a radio frequency (RF) choke, the noise waves to keep them from leaking out of an apparatus; and
   guiding, by a waveguide probe, the blocked noise waves from the apparatus to a wave-guiding structure.

11. The method of claim 10, wherein the backshort transmission line comprises vias for transferring heat from the diode to the backshort transmission line.

12. The method of claim 10, wherein the RF choke is a low pass filter.

13. The method of claim 10, wherein the diode operates in avalanche breakdown mode when reverse biased.

14. The method of claim 10, wherein the crystalline structure is a quartz structure.

15. The method of claim 10, wherein the diode is a Schottky diode operating at millimeter wave frequencies.

16. The method of claim 10, wherein the backshort transmission line is in-phase with the noise waves.

17. An apparatus comprising:
   a biasing device comprising a first terminal and a second terminal, the biasing device generating noise waves;
   a backshort transmission line connected to the first terminal, the backshort transmission line compensating a reactance of the biasing device, and wherein the backshort transmission line comprises vias for transferring heat from the biasing device to the backshort transmission line;
   a filtering component connected at the second terminal, wherein the filtering component prevents the noise waves from leaking out of an apparatus; and
   a probe connected to the second terminal for providing a path for the noise waves to a wave-guiding structure.

18. The apparatus of claim 17, wherein a crystalline structure thermally couples the biasing device and the backshort transmission line, wherein the crystalline structure transfers heat from the biasing device to the backshort transmission line.

19. The apparatus of claim 17, wherein the low pass filter comprises an RF choke and a capacitor.

20. The apparatus of claim 18, wherein the crystalline structure is a quartz structure.

* * * * *